United States Patent
Hu

(10) Patent No.: US 7,915,516 B2
(45) Date of Patent: Mar. 29, 2011

(54) THERMOELECTRIC POWER GENERATOR WITH BUILT-IN TEMPERATURE ADJUSTMENT

(75) Inventor: Ben P Hu, Lynnwood, WA (US)

(73) Assignee: The Boeing Company, Chicago, IL (US)

(*) Notice: Subject to any disclaimer, the term of this patent is extended or adjusted under 35 U.S.C. 154(b) by 756 days.

(21) Appl. No.: 11/382,632

(22) Filed: May 10, 2006

(65) Prior Publication Data

US 2007/0261729 A1 Nov. 15, 2007

(51) Int. Cl.
*H01L 35/30* (2006.01)
(52) U.S. Cl. ........ 136/210; 136/200; 136/201; 136/205; 438/54; 438/55
(58) Field of Classification Search ............ 136/200
See application file for complete search history.

(56) References Cited

U.S. PATENT DOCUMENTS

| | | | |
|---|---|---|---|
| 2,015,610 A * | 9/1935 | Underwood | 136/212 |
| 6,747,572 B2 * | 6/2004 | Bocko et al. | 340/870.16 |
| 7,007,501 B2 | 3/2006 | Hu | |
| 7,608,777 B2 * | 10/2009 | Bell et al. | 136/200 |
| 2002/0050793 A1 * | 5/2002 | Cull et al. | 315/56 |
| 2005/0204733 A1 | 9/2005 | Sasaki | |
| 2006/0118157 A1 * | 6/2006 | Johnson et al. | 136/205 |
| 2006/0130888 A1 * | 6/2006 | Yamaguchi et al. | 136/205 |

FOREIGN PATENT DOCUMENTS

WO WO2005020422 3/2005

* cited by examiner

*Primary Examiner* — Jennifer K. Michener
*Assistant Examiner* — Jayne Mershon
(74) *Attorney, Agent, or Firm* — Lee & Hayes, PLLC

(57) ABSTRACT

In one embodiment, an operating condition of a thermoelectric module is monitored. It is determined when the monitored operating condition exceeds a desired range. Upon determining the monitored operating condition exceeds the desired range, a thermal adjustment is applied to the thermal condition to direct the operating condition to within the desired range. The monitoring the operating condition may include measuring an operating temperature of an environment adjacent a surface of the thermoelectric module, a surface temperature of a portion of the thermoelectric module, a thermal differential between the first surface and the second surface of the thermoelectric module, and an output voltage of the thermoelectric module. The desired range includes a temperature range below a level at which the thermoelectric module will sustain thermal damage and a thermal differential capable of causing the thermoelectric module to generate a minimum desired output voltage.

9 Claims, 9 Drawing Sheets

*(BACKGROUND)*

THERMOELECTRIC POWER GENERATOR WITH BUILT-IN TEMPERATURE ADJUSTMENT

FIELD OF THE INVENTION

The present disclosure relates to electrical power systems, and more specifically, to generating electrical power using thermoelectric modules.

BACKGROUND OF TEE INVENTION

The "thermoelectric effect" is the conversion of a thermal differential between opposing surfaces of a thermoelectric material to electric voltage, and vice versa. The thermoelectric effect, forms of which are known as the "Peltier effect" or the "Seebeck effect," for one example, is the technology used in small electrical refrigeration systems used in portable beverage coolers and cars. Applying a voltage across a thermoelectric module causes a current to be driven through the semiconducting material of the thermoelectric module. The flow of current through the thermoelectric module causes the thermoelectric module to draw heat from a cooling side of the thermoelectric module to an opposing surface of the module. The cooling side is coupled with an enclosure that serves as a solid-state cooling device.

Conversely, the thermoelectric effect also can be used to generate electric voltage by disposing thermoelectric modules where one surface will be exposed to a relatively hot temperature, while an opposing surface will be exposed to a relatively cold temperature; instead of the voltage causing the thermal differential, the thermal differential is used to generate electric voltage.

FIG. 1 depicts a thermoelectric module 100 used to generate electric voltage. The thermoelectric module 100 is situated between a hot thermal source 110 and a cold thermal source 120, creating a thermal differential ΔH 130 between a first surface 140 of the thermoelectric module 100 presented to the hot thermal source 110 and a second surface 150 of the thermoelectric module 100 presented to the cold thermal source 120. As a result of the thermal differential 130, the thermoelectric module 100 generates a voltage differential ΔV 160.

Using thermoelectric modules to generate electrical power involves a number of concerns. First, the greater the thermal differential between the surfaces of the thermoelectric modules, the greater will be the voltage produced as a result of the thermoelectric effect. It is desirable, therefore, to dispose one side of the thermoelectric module to a much hotter or much colder environment than the opposing surface. If the thermal differential is too small, the thermoelectric modules will not generate enough voltage. Second, changes in the thermal differential affect the voltage generated. Thus, if the differential is less than anticipated, the thermoelectric module may not generate enough voltage. Alternatively, if the differential becomes greater than anticipated or desired, the thermoelectric module may produce too much voltage, and the excess voltage may damage devices that receive voltage from the thermoelectric module. Third, currently available thermoelectric modules are relatively fragile. Thus, in attempting to expose one surface of a thermoelectric module to a very hot environment in order to create a very high thermal differential, the high heat may damage the thermoelectric module.

There is growing interest in using thermoelectric modules to generate power. After all, countless engines, motors, furnaces, lights, electrical circuits, and other devices generate waste heat as a byproduct of their operation. Moreover, energy must be expended to cool these engines and other devices to keep them functioning or protect them from being damaged. Similarly, natural sources of heat, such as geothermal sources generate heat that represents a wasted opportunity for the generation of power. If this wasted or excess heat could be harnessed with thermoelectric modules, electrical energy could be generated from otherwise unused heat sources. Unfortunately, problems in maintaining sufficient thermal differentials, preventing excessive thermal differentials, or simply being unable to regulate thermal differentials undermines the practicality and effectiveness of using thermoelectric modules to generate electrical power.

SUMMARY OF THE INVENTION

Embodiments of the present invention are directed to applying a thermal adjustment to a thermoelectric module to preserve the operating conditions of a thermoelectric module within a desirable range. Embodiments of the present invention may advantageously protect thermoelectric modules from high temperatures or maintain the thermoelectric modules within a desired thermal differential.

In one embodiment, an operating condition of a thermoelectric module is monitored. It is determined when the monitored operating condition exceeds a desired range. Upon determining the monitored operating condition exceeds the desired range, a thermal adjustment is applied to the thermal condition to direct the operating condition to within the desired range. The monitoring of the operating condition may include measuring an operating temperature of an environment adjacent a surface of the thermoelectric module, a surface temperature of a portion of the thermoelectric module, a thermal differential between the first surface and the second surface of the thermoelectric module, or an output voltage of the thermoelectric module. The desired range includes a temperature range below a level at which the thermoelectric module will sustain thermal damage or a thermal differential capable of causing the thermoelectric module to generate a minimum desired output voltage.

BRIEF DESCRIPTION OF THE DRAWINGS

Embodiments of the present invention are described in detail below with reference to the following drawings.

DETAILED DESCRIPTION

Embodiments of the present invention are related to regulating a temperature of a thermoelectric module presented to a heat source. By regulating the temperature of the thermoelectric module or the thermal differential across the thermoelectric module, the output voltage of the thermoelectric module can be regulated, and the thermoelectric module can be protected from damage.

Figure 1:
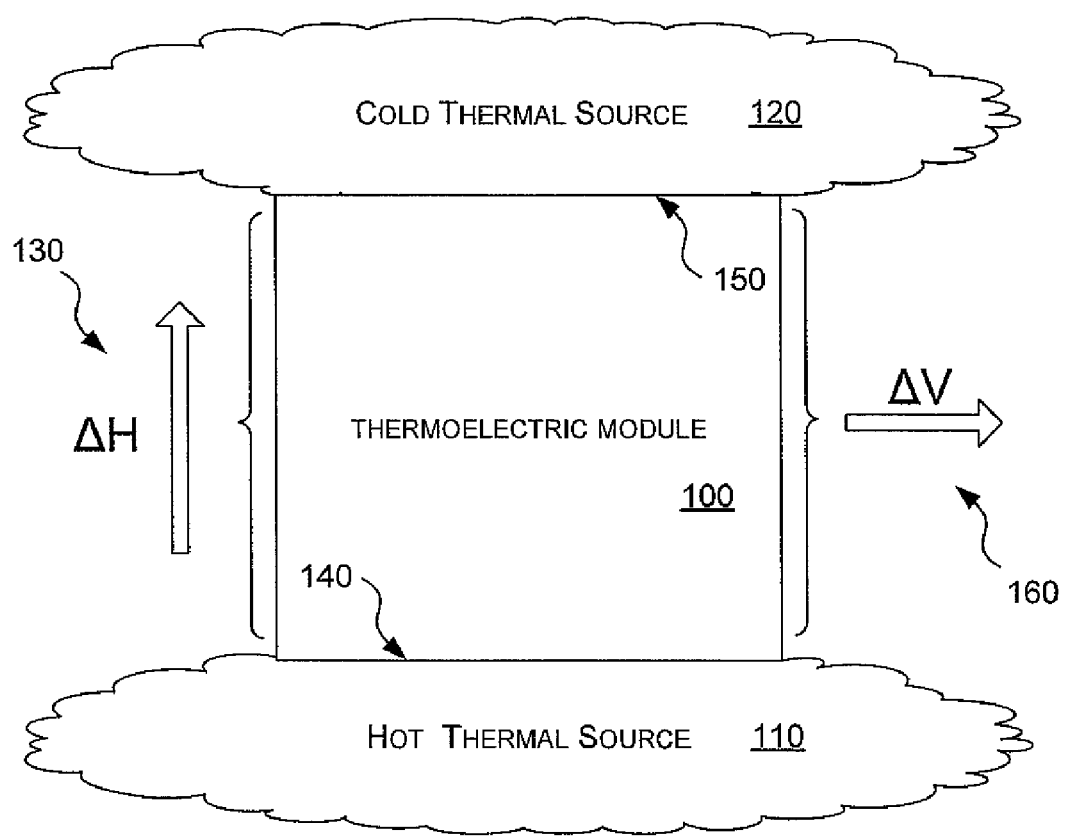
FIG. 1 (Background) is block diagram of a thermoelectric module generating an output voltage as a result of being disposed to a thermal differential.
Figure 2:
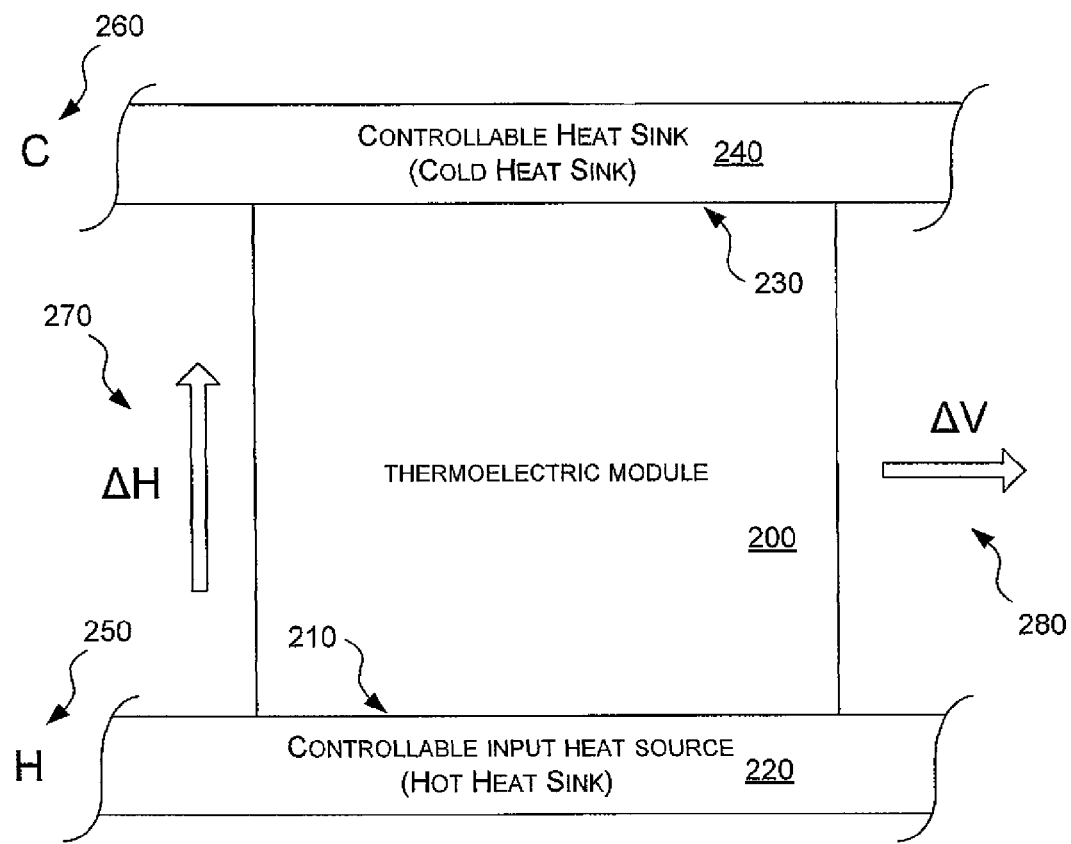
FIG. 2 is a block diagram of a thermoelectric module equipped with a controllable heat sink according to an embodiment of the present invention.

FIG. 2 is a general, schematic view of a thermoelectric module 200 with which an embodiment of the invention is used. A first surface 210 of the thermoelectric module 200 is presented to an input heat source 220. The input heat source 220, in one mode, is a source of waste heat, such as an engine coolant line or an engine exhaust. The input heat source 220 may include a "hot" heat sink that conveys heat from a principal heat source. For example, if the principal heat source is an engine, the input heat source 220 may include a heat sink that conveys heat from an exhaust line or cooling line running from the engine block. Embodiments of the invention may include a controllable heat sink or heat source allowing the heat conveyed to the heat sink to be regulated, for example, to prevent thermal damage to the thermoelectric module 200.

A second surface 230 of the thermoelectric module 200 is presented to a controllable heat sink 240. A difference between a temperature H 250 of the input heat source 220 and a temperature C 260 of the controllable heat sink 240 results in a thermal differential ΔH 270. The thermal differential ΔH 270 applied across the thermoelectric module 200 results in a voltage differential ΔV 280. The voltage differential ΔV 280 is proportional to the thermal differential ΔH 270.

In a context where the input heat source 220 is a waste heat source, such as an engine coolant line or engine exhaust, the temperature H 250 typically will vary. As previously described, the variation of the temperature H 250 may present problems if the temperature H 250 is either too low or too high.

To account for these variations, the controllable heat sink 240 allows for the temperature C 260 to be varied to change the thermal differential ΔH 270. Thus, if the temperature H 250 is too low relative to the temperature C 260, the controllable heat sink 240 can be cooled to reduce the temperature C 260 and increase the thermal differential ΔH 270. On the other hand, if the temperature H 250 is too high, the temperature of the controllable heat sink H 220 can be cooled to protect the thermoelectric module 200 from damage. Alternatively, if the thermal differential ΔH 270 is generating too high of a voltage differential ΔV 280, the temperature C 260 of the controllable heat sink can be increased to reduce the thermal differential ΔH 270 and, in turn, reduce the voltage differential ΔV 280. In one embodiment, the input heat source 220 could be controllably coupled with the controllable heat sink 240 to reduce the thermal differential across the thermoelectric module 200. Correspondingly, when the input heat source 220 includes a heat sink conveying heat from a principal heat source, the heat conveyed from the principal heat source may also be regulated to control the heat applied to the thermoelectric module 200, as well as to regulate the thermal differential ΔH 270 applied across the thermoelectric module 200.

Figure 3A:
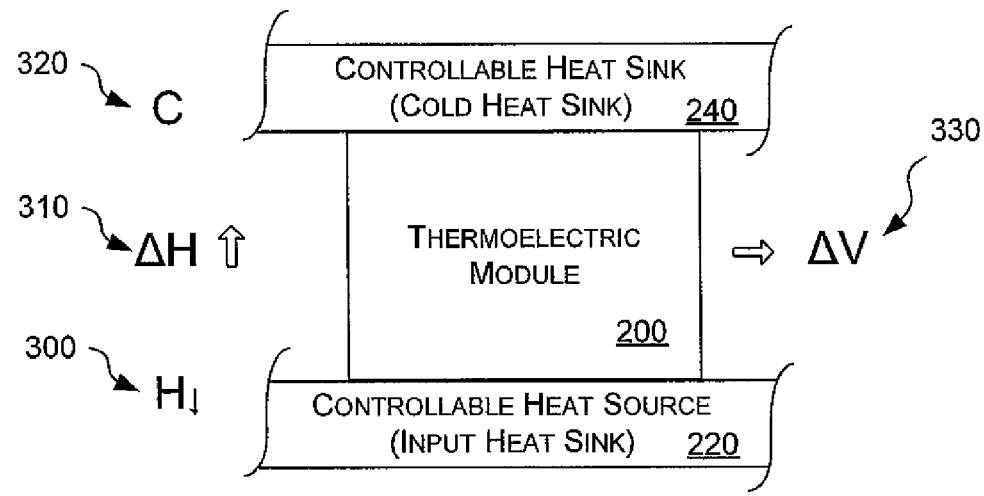
FIGS. 3A-3B and 4A-4B are block diagrams of a thermoelectric module submitted to a thermal differential and a thermal adjustment to adjust a voltage differential generated by the thermoelectric module.

FIG. 3A illustrates an exemplary case when the temperature H 300 presented by the heat source 220 is lower than desired. As in the case of the exemplary embodiments illustrated in this and other figures, the input heat source 220 may include a controlled or uncontrolled heat source. Because the temperature H 300 is lower than desired, the thermal differential ΔH 310 between the temperature H 300 and the temperature C 320 across the thermoelectric module 200 yields a resulting voltage differential ΔV 330 lower than desired.

Figure 3B:
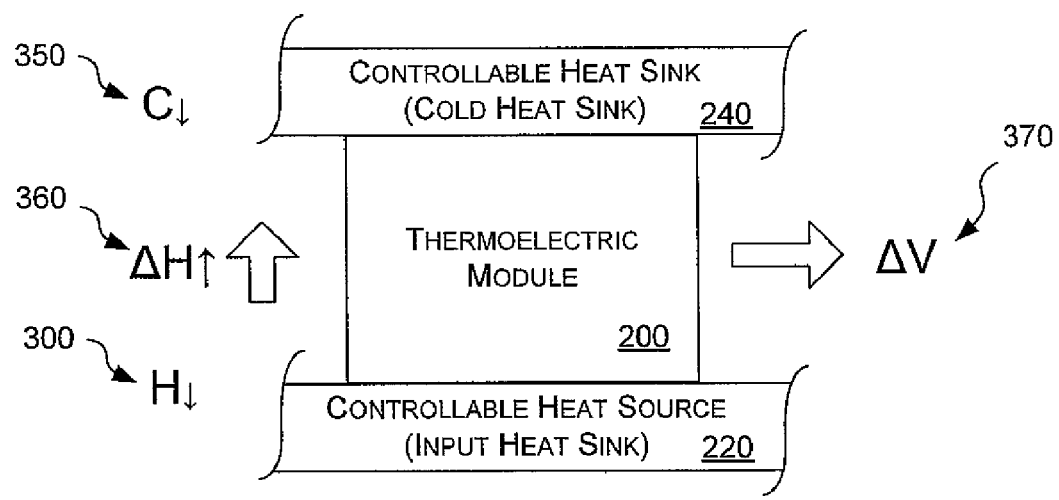

FIG. 3B illustrates how, using one embodiment, the temperature C 350 of the controllable heat sink 240 is reduced, causing an increased thermal differential ΔH 360 with no change in the temperature H 300 of the heat source 220. The increased thermal differential ΔH 360 yields an increased voltage differential ΔV 370 across the thermoelectric module 200.

Figure 4A:
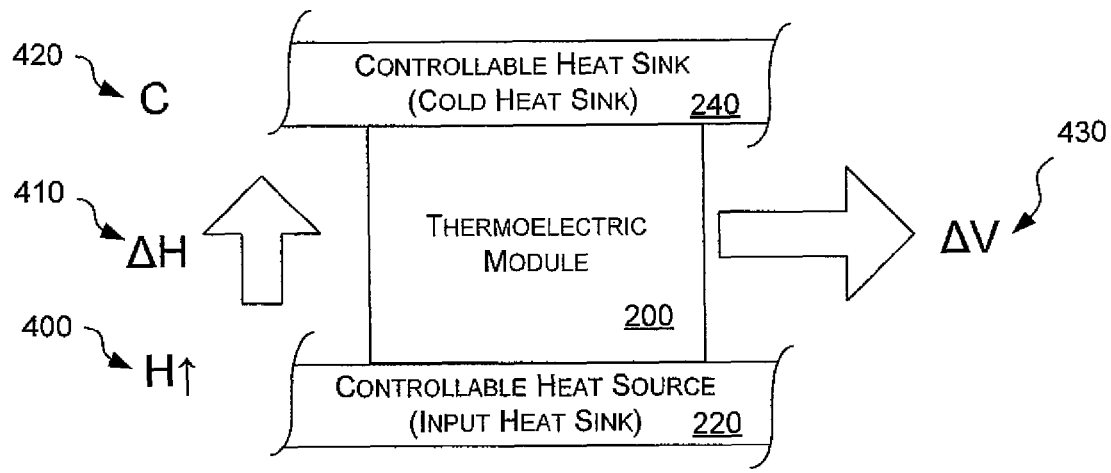

On the other hand, FIG. 4A illustrates an exemplary case in which the temperature H 400 presented by the heat source 220 is higher than desired. The thermal differential ΔH 410 between the temperature H 400 and the temperature C 420 across the thermoelectric module 200 becomes higher than intended or desired, resulting in a voltage differential ΔV 430 that also is higher than is desired or intended. It should be noted that a change in the voltage differential is not necessarily a linear response as a result of a change in a thermal differential. Accordingly, thermal adjustments applied to adjust for changes in the temperature H 400 should consider the voltage differential-to-thermal differential response of the thermoelectric module.

Figure 4B:
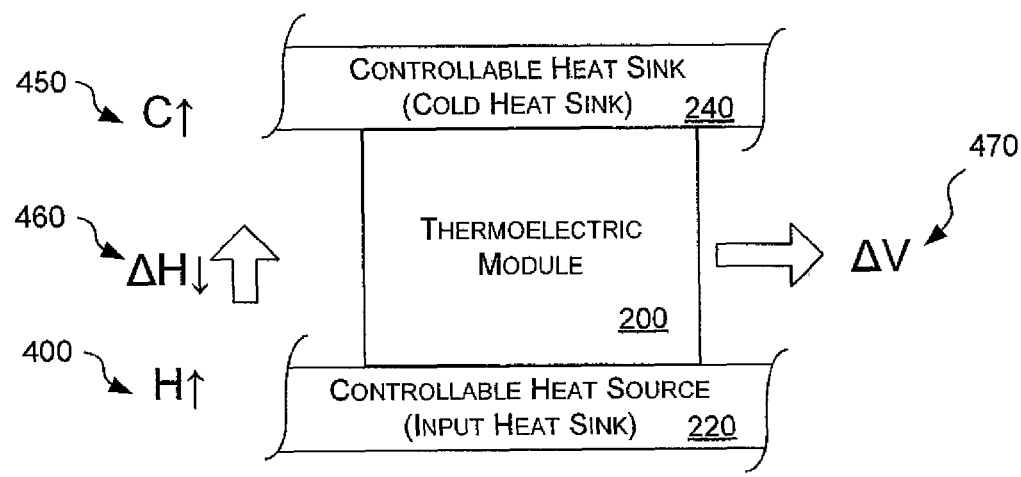

FIG. 4B illustrates how the temperature C 450 of the controllable heat sink 240 is increased, causing a reduced thermal differential ΔH 460 with no change in the temperature H 400 of the heat source 220. The reduced thermal differential ΔH 460 yields a reduced voltage differential ΔV 470 across the thermoelectric module 200. Alternatively, if the heat source 220 includes an input heat sink conveying heat from a principal heat source, the heat conveyed from the principal heat source to the heat sink can be regulated, as described further below. Thus, regulating the heat conveyed to the input heat source 220 can reduce the heat applied to the thermoelectric module to protect the thermoelectric module from damage, or adjust the thermal differential ΔH 460 to cause a reduced voltage differential ΔV 370 across the thermoelectric module 200.

As illustrated in the examples of FIGS. 3A-3B and 4A-4B, the temperature of the controllable heat sink 240 can be adjusted to change the thermal differential across the thermoelectric module 200 to account for variations in the heat supplied by the heat source 220. The thermal differential thus can be changed to change the resulting voltage differential. Alternatively, the temperature applied by the controllable heat sink 240 can be adjusted to reduce the temperature or the thermal differential to which the thermoelectric module 200 is subjected to reduce damage to the thermoelectric module. Further alternatively, the heat conveyed from the principal heat source to the heat sink can be regulated to reduce the temperature or the thermal differential to which the thermoelectric module 200 is subjected to reduce damage to the thermoelectric module.

The controllable heat sink may be manifested in a number of forms, and the temperature of the controllable heat sink may be controlled using a variety of systems. The cooling system may include a fluid cooled system, in which the fluid may be in a gaseous or a liquid form. Also, as is described further below, it may be desirable to employ a control system to direct the operations of the cooling system. The control system can monitor the operating conditions of the thermoelectric module, and as a result of those conditions, adjust the cooling applied to the controllable heat sink to adjust or maintain the thermal differential across the thermoelectric module.

Figure 5A:
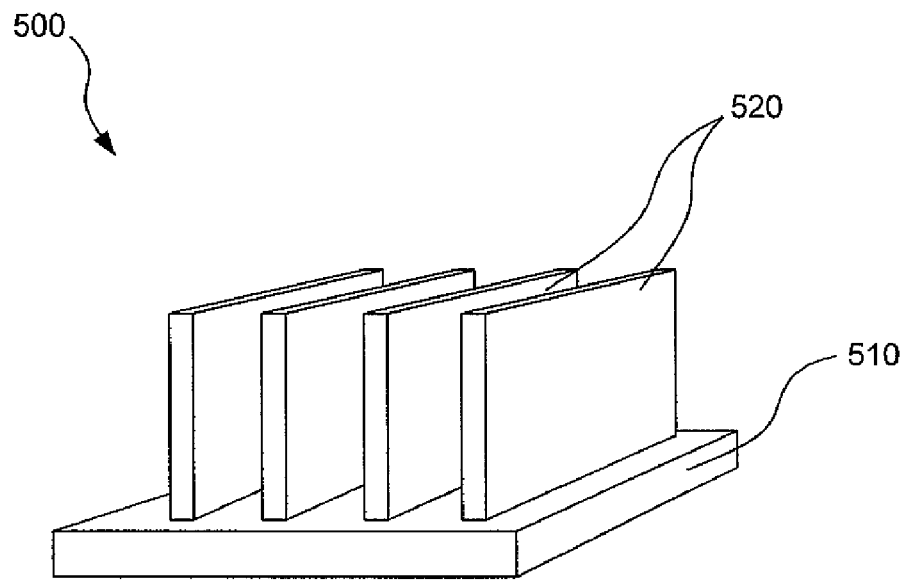
FIGS. 5A-5B are isometric views of heat sinks suitable for applying a thermal adjustment to a thermoelectric module in an air-based or other gas-based cooling system.
Figure 5B:
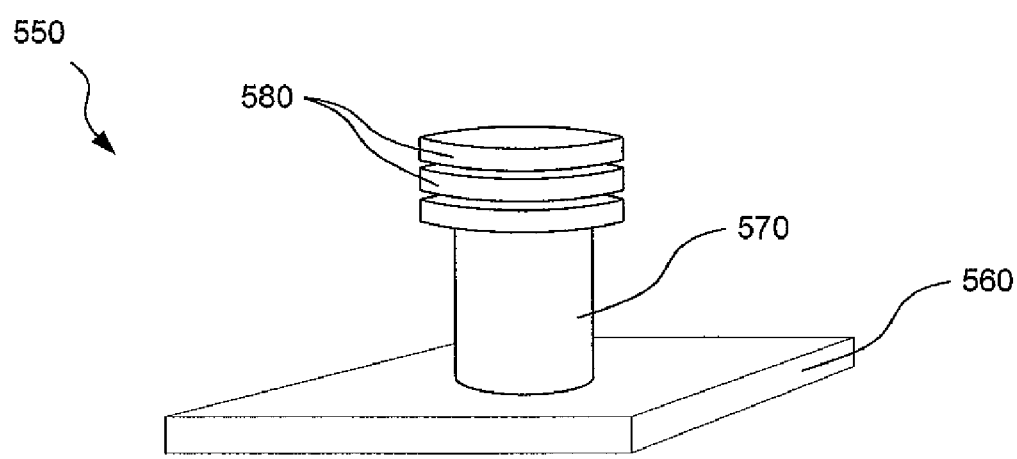
Figure 6A:
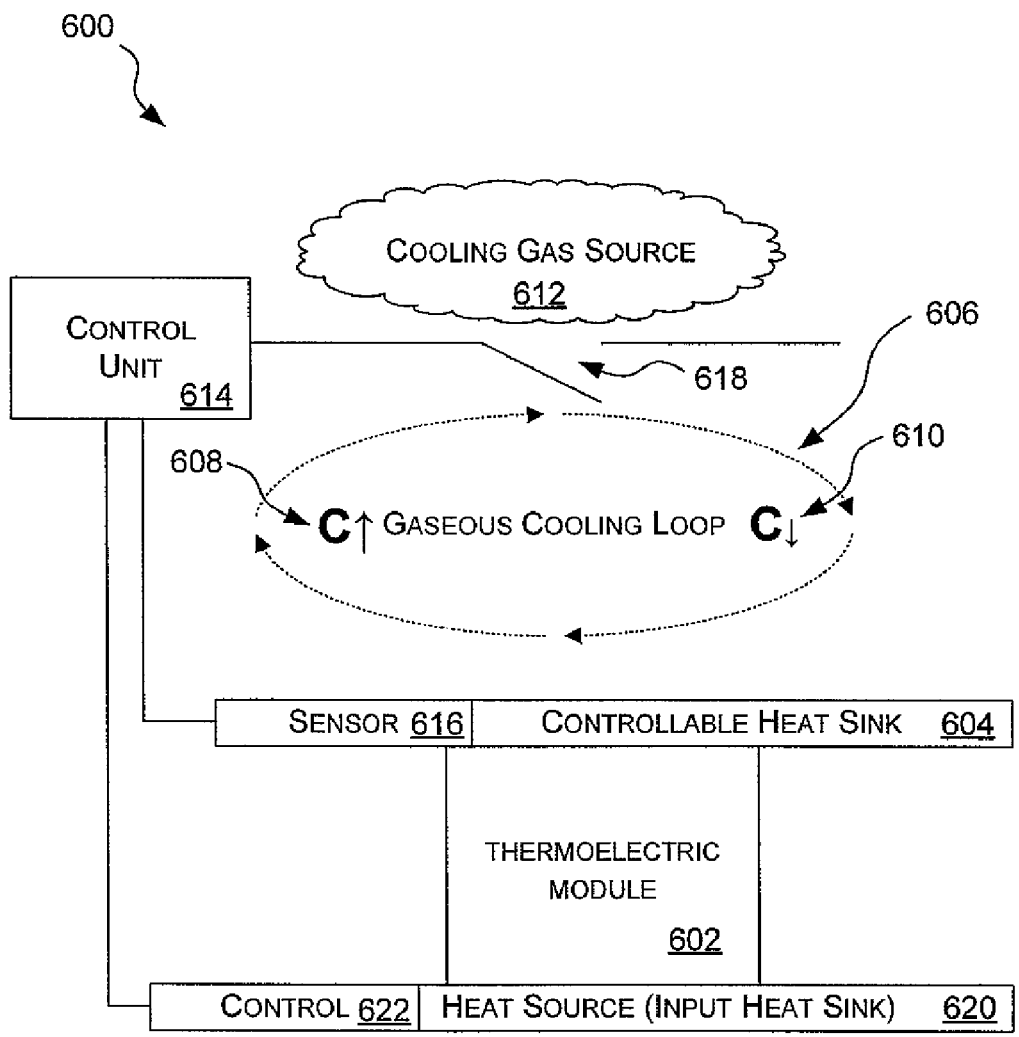
FIG. 6A is a block diagram of an air-based or gas-based cooling system for applying a thermal adjustment to one surface of one or more thermoelectric modules.

A first exemplary cooling system uses air cooling, or cooling with another gas, as illustrated in FIGS. 5A and 5B and FIG. 6A. FIGS. 5A and 5B illustrate heat sinks that are suitable for an air-cooled or other gas-cooled system. FIG. 5A shows a heat sink 500 that includes a planar block 510 that supports a plurality of cooling fins 520. Both the planar block 510 and the cooling fins 520 are composed of a thermally-conductive material, such as copper, or an aluminum alloy. The planar block 510 is disposed on the component to be cooled. The planar block 510 conveys heat generated by the component to the fins 520. The fins 520, which present an increased surface area for the disbursal of heat, radiate the heat to the environment surrounding the fins 520.

FIG. 5B shows a heat sink 550 that includes a planar block 560 that supports one or more heat pipes 570 that disburse heat from the planar block. The heat pipe 570 may include a plurality of fins 580 at an end removed from the planar block 560 to further facilitate temperature transfer. In one embodiment, the heat pipe 570 is a hollow, enclosed tube in which a coolant, such as water, ethanol, or mercury is enclosed. When the heat pipe 570 operates in alignment with gravity, gravity draws the coolant to an end adjacent the planar block 560. Heat emanating from the planar block 560 causes the coolant to evaporate where it is cooled at the opposite end, where the coolant condenses and falls back toward the end disposed at the planar block 560. Where the heat pipe 570 will operate in a context where it is not aligned with gravity, an internal wicking structure is employed to draw the condensed coolant toward a surface disposed at the planar block. The heat sinks 500 and 550 are two exemplary forms of heat sinks; other types of heat sinks also are suitable for an embodiment of a controllable heat sink using air-cooling or gas-cooling. Embodiments of the invention may also employ vapor chamber heat sinks or any other desired form of heat sinks for applying thermal adjustments to the thermoelectric module. Embodiments of the invention are not limited to the use of any particular selected form of heat sink.

Figure 6B:
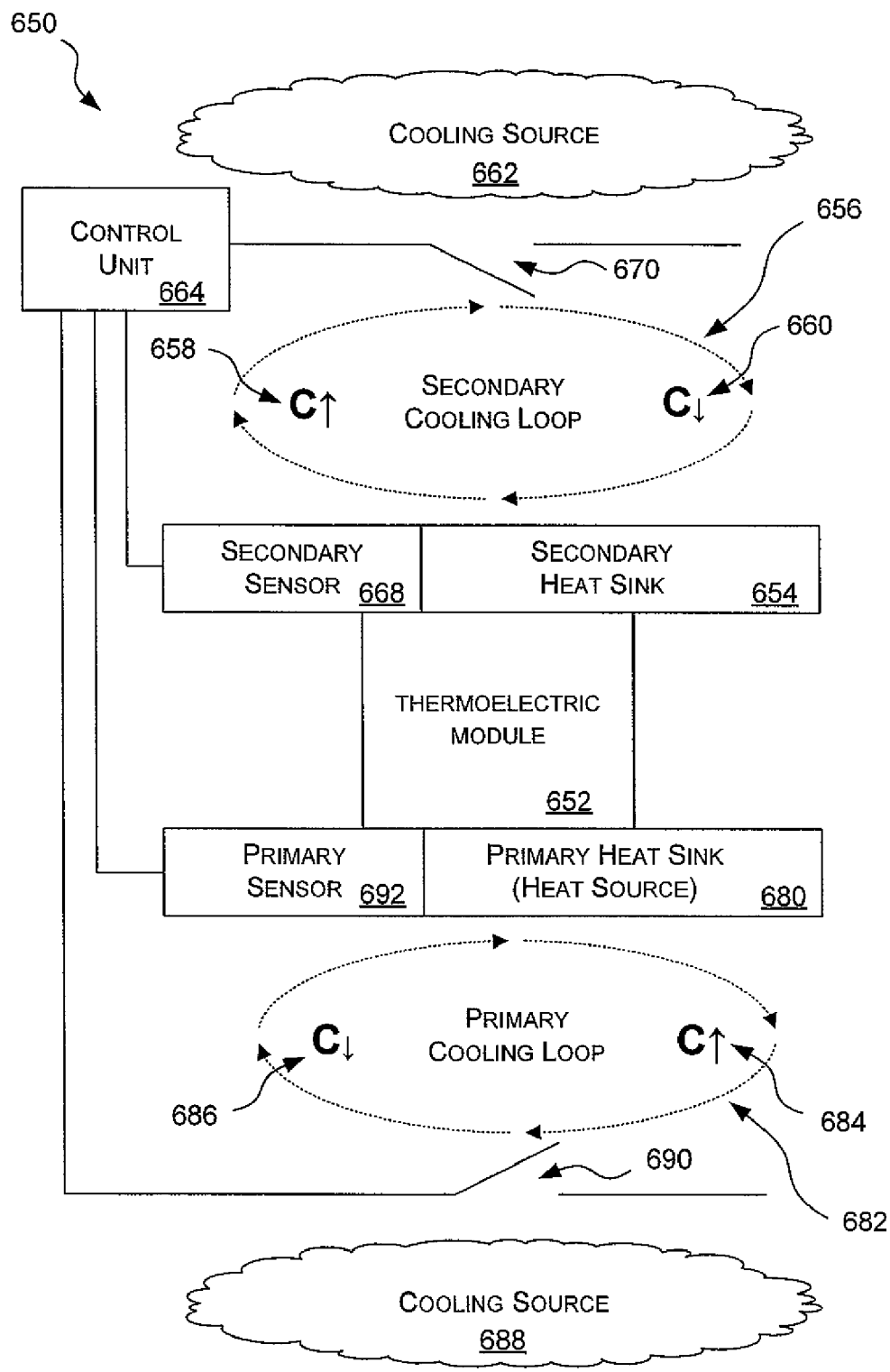
FIG. 6B is a block diagram of a cooling system for applying a thermal adjustment to both opposing surfaces of a thermoelectric module.

FIGS. 6A and 6B illustrate exemplary embodiments of systems for applying thermal adjustments to thermoelectric modules to protect the modules from damage, control the voltage output of the modules, or to address other operating concerns. The systems of FIGS. 6A and 6B both include, but do not show, original heat sources used to develop the thermal differential that supports the thermoelectric effect exploited by the thermoelectric modules. Many original heat sources may be used. For example, in a vehicle such as an automobile, an aircraft, a watercraft, or any other type of vehicle, the engine that motivates the vehicle will generate heat both as a result of cooling the engine and in the engine's exhaust. Either or both of these heat sources may be exploited to supply heat to facilitate a thermoelectric effect. Similarly, machinery or other industrial systems, including engines, motors, furnaces, or any other type of machinery, generate heat that can be used to facilitate a thermoelectric effect. Further still, naturally occurring phenomena, such as radiant heat from the Earth or the Sun, or geothermal heat in liquid or steam form can be used to facilitate a thermoelectric effect. Any of these heat sources, or any other heat source, can be tapped to facilitate a thermoelectric effect.

Notwithstanding, for visual clarity, these original heat sources are not included in FIGS. 6A or 6B, as they were not included in FIGS. 4A-4B and 5A-5B. As described, the input heat sinks or heat sources shown convey heat from the original heat source to facilitate the thermoelectric effect. In some embodiments, the heat conveyed is controlled to apply thermal adjustments to the thermoelectric modules, or the heat conveyed is controlled as part of applying thermal adjustments to the thermoelectric modules.

FIG. 6A illustrates a cooling system 600 suitable for transferring heat from a thermoelectric module 602 equipped with a controllable heat sink 604. The controllable heat sink 604 is disposed in a gaseous cooling loop 606. Upon passing over the heat sink 604, gas is heated to an elevated temperature $C\uparrow$ 608. The gas at the elevated temperature $C\uparrow$ 608 is circulated by convection, a fan, or other motivating force (not shown) until it is exposed to a cooling gas source 612. The cooling gas source 612 cools the gas to a reduced temperature $C\downarrow$ 610, where it circulates via the cooling loop 606 to draw heat from the heat sink 604.

In one mode, the cooling system 600 includes a control unit 614 that is coupled with a sensor 616 that monitors operating conditions of the thermoelectric module 602. The control unit may include a thermostat or another type of control logic operable to direct a cooling mechanism 618 to control the degree of cooling applied within the cooling loop 606 based on the operating conditions. For example, the sensor 616 may monitor the operating temperature of the thermoelectric module 602, including the environmental temperature attending the thermoelectric module 602, or the surface temperature of the thermoelectric module 602. Alternatively, because the voltage differential generated by the thermoelectric module 602 is proportional to the thermal differential to which the thermoelectric module 602 is subjected, the sensor 616 may monitor the voltage generated by the thermoelectric module 602 as indicative of the thermal differential to which the thermoelectric module 602 is exposed.

The cooling mechanism 618 may include a controlled port, a fan, or another mechanism the control unit 614 directs in response to the operating conditions read from the sensor 616. In a system such as automobile, where the heat source 620 includes a cooling line or an exhaust line from the engine, or a heat sink conveying heat from the cooling line or an exhaust line, the cooling mechanism 618 may include a fan mechanically engaged to an engine to take advantage of the operation of the engine to motivate a flow from the cooling gas source 612 to the cooling cycle. The fan may include a clutch mechanism to selectively increase the air flow based on signals from the control unit 614. The clutch mechanism could be selectively engaged and geared by the control unit in order to control the thermal adjustment applied by the fan. Thus, if the sensor 616 indicates that more cooling is needed, the control unit 614 engages the cooling mechanism 618 to increase the contact of the cooling gas source 612 with the cooling cycle 606. Conversely, if less cooling is needed, the control unit 614 can engage the cooling mechanism 618 to reduce the exposure of the cooling cycle 606. Alternatively, in a system such as a jet aircraft, where the heat source 620 includes hot jet exhaust, the cooling mechanism 618 may include a panel that exposes the cooling cycle 606 to ambient air as a cooling gas source 612. Because jet engines operate at high altitudes where the ambient air is quite cold and inherently flows by at very high speeds, controlling the area of the cooling loop 606 exposed to the cooling gas source 612 may be affected by selectively opening or closing a panel to the outside air.

The control unit 614 also is coupled with a control 622 operable to control the heat supplied to the input heat sink or heat source 620 from an original heat source (not shown). Thus, whether the original heat source is from an engine, a natural source, or another source, the control unit can reduce the heat applied to the thermoelectric module and change the thermal differential applied to the input heat sink or heat source. The control 622 may include a valve or similar control that can be used to reduce the heat conveyed to the input heat sink or heat source 620.

FIG. 6B illustrates another cooling system 650 suitable for controlling the thermal differential applied to a thermoelectric module 652 by controlling the heat applied to each of the surfaces of the thermoelectric module. As in the system 600 (FIG. 6A), the cooling system 650 transfers heat from a thermoelectric module 652 equipped with a secondary heat sink 654. The secondary heat sink 654 is disposed in a secondary cooling loop 656, which may include a gaseous or a liquid cooling loop. Upon passing over the secondary heat sink 654, cooling fluid, either gaseous or liquid, is heated to an elevated temperature C↑ 658. The fluid at the elevated temperature C↑ 658 is circulated by convection, a fan, or other motivating force (not shown) until it is exposed to a cooling source 662. The cooling source 662 cools the fluid to a reduced temperature C↓ 660, where it circulates via the secondary cooling loop 656 to draw heat from the secondary heat sink 654.

The cooling system 650 includes a control unit 664 that is coupled with a secondary sensor 668 that monitors operating conditions of the thermoelectric module 652. The control unit 664 may include a thermostat or another type of control logic operable to direct a cooling mechanism 670 to control the degree of cooling applied within the secondary cooling loop 656 based on the operating conditions. For example, the secondary sensor 668 may monitor the operating temperature of the thermoelectric module 652, including the environmental temperature attending the thermoelectric module 652, or the surface temperature of the thermoelectric module 652. Alternatively, because the voltage differential generated by the thermoelectric module 652 is proportional to the thermal differential to which the thermoelectric module thermoelectric module 652 as indicative of the thermal differential to which the thermoelectric module 652 is exposed.

The cooling mechanism 670 may include a controlled port, a fan, or another mechanism the control unit 664 directs in response to the operating conditions read from the sensor 668. In a system such as automobile, where the heat source includes a primary heat sink 680 that conveys heat from a principal heat source, such as a cooling line or an exhaust line from the engine, the cooling mechanism 670 may include a fan mechanically engaged to an engine to take advantage of the operation of the engine to motivate a flow from the cooling source 662 to the cooling cycle. The fan may include a clutch mechanism to selectively increase the air flow based on signals from the control unit 664 as previously described with regard to FIG. 6A. Thus, if the sensor 668 indicates that more cooling is needed, the control unit 664 engages the cooling mechanism 670 to increase the contact of the cooling gas source 662 with the cooling cycle 656. Conversely, if less cooling is needed, the control unit 664 can engage the cooling mechanism 670 to reduce the exposure of the cooling cycle 656.

Additionally, because heat is applied to the thermoelectric module 652 by a primary heat sink 680 conveying heat from a principal heat source, the operating conditions to which the thermal module 652 is subjected can be regulated by adjusting the heat conveyed to the primary heat sink 680. The heat conveyed by the primary heat sink 680 can be regulated in a number of different ways. For example, if the heat is conveyed to the primary heat sink 680 by a fluid, the flow of fluid can be restricted so that the primary heat sink 680 receives less heat. The heat conveyed may be regulated by the control unit 664, or another control unit. The control unit 664 suitably is coupled with a primary sensor 692 that measures the temperature of the primary heat sink 680, the surface temperature of the thermoelectric module 652, or the attendant temperature about the thermoelectric module 652. The control unit 664, thus, may restrict the fluid flow that conveys heat to the primary heat sink 680 when the temperature or thermal differential to which the thermoelectric module 652 is subjected becomes too high.

Alternatively, as illustrated in FIG. 6B, the primary heat sink 680 may convey heat from the original heat source (not shown), and the primary heat sink 680 is cooled by another primary cooling loop 682. The control unit 664 coupled with the primary sensor 692 monitors operating conditions of the thermoelectric module 652 and controls a cooling mechanism 690 to regulate the cooling of the primary heat sink 680. The cooling mechanism 690 may include a controlled port, a fan, or another mechanism the control unit 664 directs in response to the operating conditions read from the primary sensor 692. Thus, if the primary sensor 692 indicates that more cooling is needed, the control unit 664 engages the cooling mechanism 690 to increase the contact of the cooling source 668, which may be the same cooling source used in the secondary cooling loop 656 or a different cooling source. Conversely, if less cooling is needed, the control unit 664 can engage the cooling mechanism 690 to reduce the exposure of the primary cooling cycle 682.

Upon passing over the primary heat sink 680, cooling fluid, either gaseous or liquid, is heated to an elevated temperature C↑ 684. The fluid at the elevated temperature C↑ 684 is circulated by convection, a fan, or other motivating force (not shown) until it is exposed to a cooling source 688. The cooling source 688 cools the fluid to a reduced temperature C↓ 686, where it circulates via the primary cooling loop 682 to draw heat from the primary heat sink 680.

Figure 7:
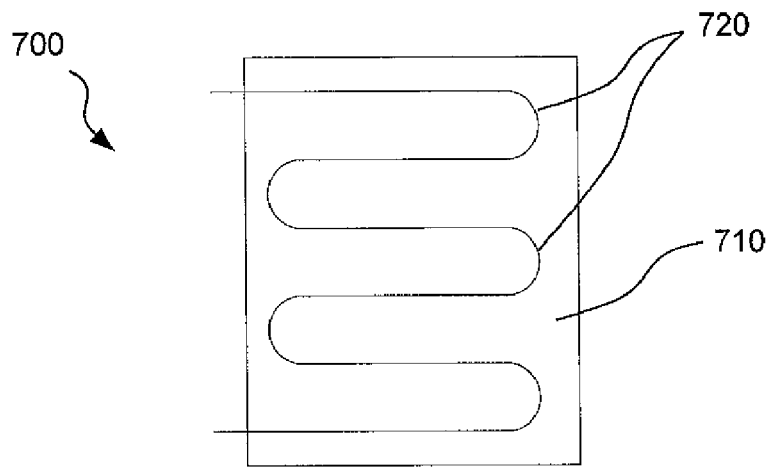
FIG. 7 is a block diagram of a heat sink suitable for applying a thermal adjustment to a thermoelectric module using a liquid-based cooling system.
Figure 8:
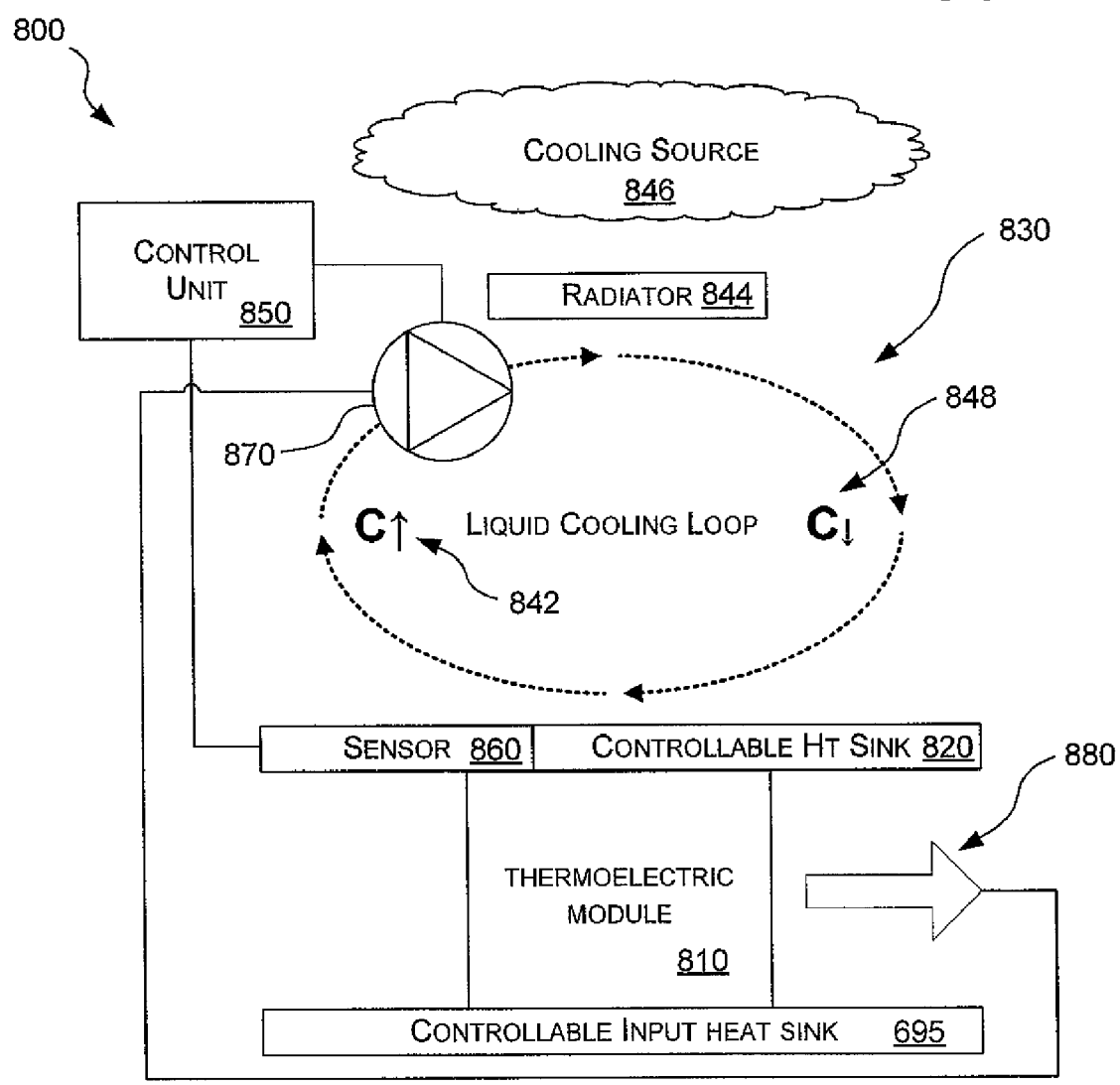
FIG. 8 is a block diagram of a liquid-based cooling system for applying a thermal adjustment to one or more thermoelectric modules.

FIGS. 7-8 illustrate a controllable heat sink and a cooling system in which liquid cooling is used to cool a thermoelectric module. FIG. 7 illustrates a liquid cooled heat sink 700. The heat sink 700 includes a planar block 710 that is disposed against the component to be cooled, such as a thermoelectric module. The planar block 710 comprises a thermally conductive material to transfer heat from the thermoelectric module to loops of a cooling tube 720. The cooling tube 720 receives cooled liquid that absorbs heat from the planar block 710 and carries the heated liquid through a cooling loop as described in connection with FIG. 8. This type of heat sink is commonly termed a cold plate heat exchanger.

FIG. 8 illustrates a liquid cooling system 800 suitable for transferring heat from a thermoelectric module 810 equipped with a heat sink 820. The controllable heat sink 820 may include a cold plate heat exchanger as described in connection with FIG. 7 that is included in a liquid cooling loop 830. Upon passing through the heat sink 820, liquid is heated to an elevated temperature C↑ 842. The liquid at the elevated temperature C↑ 842 is circulated by a pump 870 that circulates the liquid coolant around the cooling loop 830 between the controllable heat sink 820 and a radiator 844. The liquid coolant circulates through the radiator 844, which also may be in the nature of the heat sink 700 of FIG. 7. As the liquid coolant passes through the radiator 844, it transfers heat to a cooling source 846. In a system such as an automobile or an aircraft, the cooling source 846 may be the ambient air to which the radiator 844 is exposed. Alternatively, the cooling source 846 may include a body of water, such as a river, lake, or ocean, when the thermoelectric module 810 is included in a watercraft or another system that operates adjacent to the body of water, or a hot spring or other liquid geothermal source. The cooling source 846 cools the liquid coolant to a reduced temperature C↓ 848, where it returns via the cooling loop 830 to draw heat from the heat sink 820.

In one mode, the cooling system 800 includes a control unit 850 that is coupled with a sensor 860 that monitors the operating conditions of the thermoelectric module 810. The control unit 850 may include a thermostat or another type of control logic operable to direct a cooling mechanism, such as the pump 870, to control the degree of cooling applied within the cooling loop 830 based on the operating conditions. For example, the sensor 860 may monitor the operating temperature of the thermoelectric module 810, including the environmental temperature attending the thermoelectric module 810, or the surface temperature of the thermoelectric module 810. Alternatively, because the voltage differential generated by the thermoelectric module 810 is proportional to the thermal differential to which the thermoelectric module 810 is subjected, the sensor 860 may monitor the voltage 880 generated by the thermoelectric module 810 as indicative of the thermal differential to which the thermoelectric module 810 is exposed.

In one embodiment, the pump 870 is an electric pump that is powered, for example, by a portion of the voltage 880 generated by the thermoelectric module 810. Alternatively, the pump 870 may include a pump that is mechanically coupled to and driven by an engine, where the pump 870 includes a clutched mechanism controlling the degree of cooling transferred from the cooling source 846 to the radiator 844. The clutch or other switching mechanism used to control the pump may be powered by a portion of the voltage 880 generated by the thermoelectric module 810.

Figure 9:
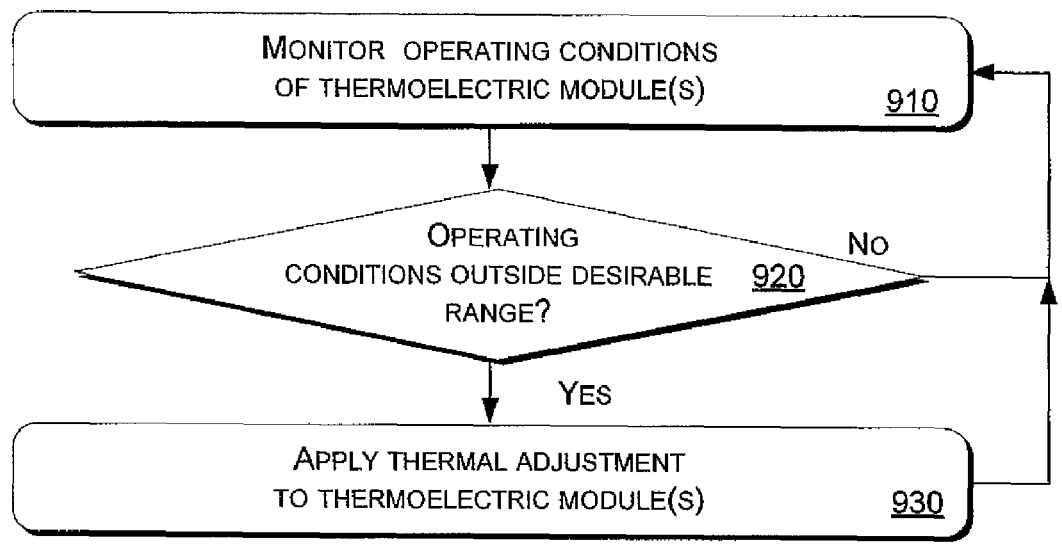
FIG. 9 is a flow diagram of a process of applying a thermal adjustment to a thermoelectric module to maintain a desired level of operation of the thermoelectric module.
Figure 10:
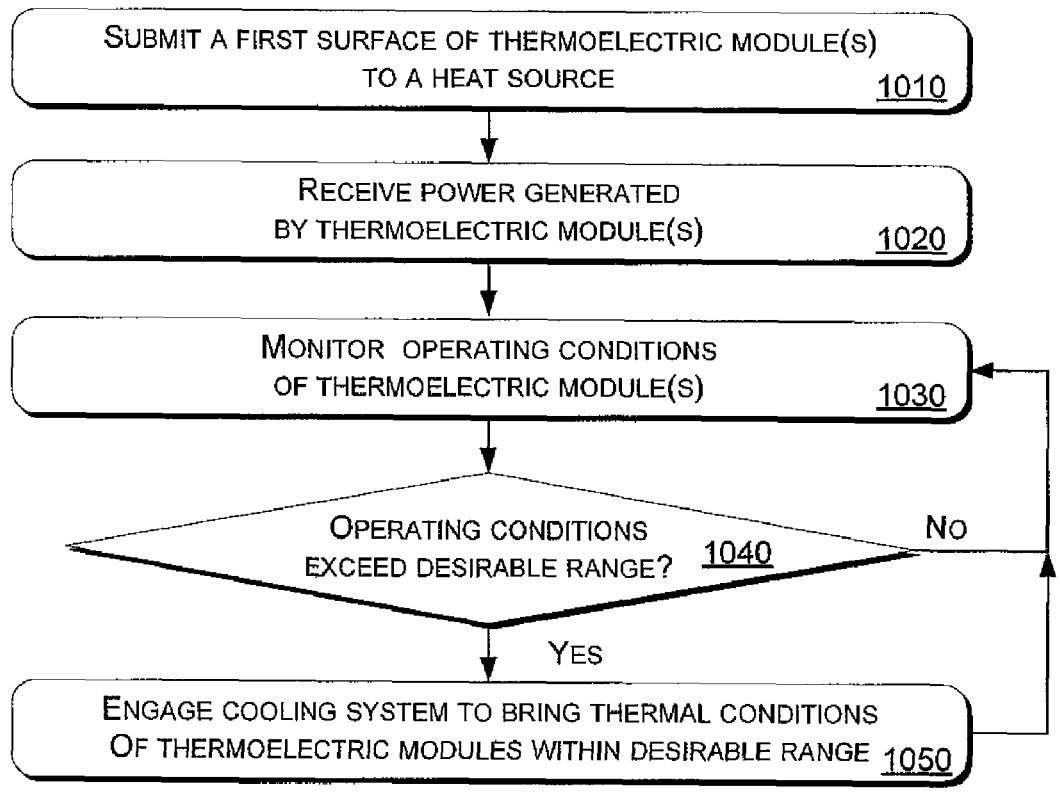
FIG. 10 is a flow diagram of a process of using a thermoelectric module to generate power while applying thermal adjustments to maintain the desired level of operation of the thermoelectric module.

Using the exemplary systems previously described or other temperature adjustment systems, FIGS. 9 and 10 illustrate modes of adjusting the temperature of a thermoelectric module used to generate power. FIG. 9 is a generalized mode of applying a temperature adjustment to a thermoelectric module. At 910, operating conditions of one or more thermoelectric modules are monitored. As previously described, for example, the operating conditions may include an ambient temperature attending a thermoelectric module, or a surface temperature of a thermoelectric module. Alternatively, the operating conditions may include a voltage output of a thermoelectric module, which is representative of the thermal differential to which the thermoelectric module is subjected.

At 920, it is determined if the operating conditions are outside the desirable operating range of the thermoelectric module. For example, if the surface temperature of the thermoelectric module is too high, or the thermal differential to which the thermoelectric module is subjected is too high so as to possibly damage the thermoelectric module or produce excessive voltage, the operating conditions may be determined to transcend a desirable range. If so, at 930, thermal adjustment is applied to the thermoelectric modules. For example, if thermal adjustment is to be applied to the thermoelectric modules, a cooling mechanism such as a fan, pump, or access panel is motivated to apply a thermal adjustment to bring the thermoelectric modules back to within a desired operating range. Once the thermal adjustment is applied, or if it was found at 920 that the operating conditions are not beyond a desired operating range, at 910, the operating conditions of the thermoelectric module continue to be monitored.

FIG. 10 illustrates a mode of generating electrical power using one or more thermoelectric modules, and applying a thermal adjustment to facilitate the desirable operation of the thermoelectric modules. At 1010, a first surface of the thermoelectric module or cells is submitted to a heat source that is used to create a thermal difference to enable the thermoelectric effect. At 1020, the power generated by the thermoelectric module or cells is received by a system that will store or use the power. At 1030, operating conditions of one or more thermoelectric modules are monitored.

At 1040, it is determined if the operating conditions are outside the desirable operating range of the thermoelectric module. If so, at 1050, a thermal adjustment is applied to the thermoelectric modules. For example, if a thermal adjustment is to be applied to the thermoelectric modules, a cooling mechanism such as a fan, pump, or access panel is motivated to apply a thermal adjustment to bring the thermoelectric modules back to within a desired operating range. Once the thermal adjustment is applied, or if it was found at 1040 that the operating conditions are not beyond a desired operating range, at 1030, the operating conditions of the thermoelectric module continue to be monitored.

While preferred and alternate embodiments of the invention have been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for generating electric voltage, comprising:
   disposing a first heat sink on a first surface of a thermoelectric module;
   submitting the first surface of the thermoelectric module to a heat source, wherein the first heat sink conveys heat from the heat source to the first surface;
   disposing a second heat sink on a second surface opposite the first surface;
   monitoring an output voltage of the thermoelectric module that is generated by a thermal differential between the first surface and the second surface of the thermoelectric device;
   determining when the output voltage of the thermoelectric module crosses a maximum voltage threshold; and
   upon determining the monitored output voltage of the thermoelectric module crosses the maximum voltage threshold, applying a thermal adjustment to the first heat sink by activating circulation of a first cooling fluid between the first heat sink and a cooling source in a first cooling loop and applying a thermal adjustment to the second heat sink by activating circulation of a second cooling fluid between the second heat sink and a second cooling source in a second cooling loop to direct the output voltage to equal or below the maximum voltage threshold.

2. A method of claim 1, wherein the output voltage above the maximum voltage threshold damages a device that receives the output voltage.

3. A method of claim 1, wherein the output voltage is linearly or non-linearly related to the thermal differential between the first surface and the second surface of the thermoelectric device.

4. A method of claim 3, wherein the maximum voltage threshold corresponds to a magnitude of the thermal differential between the first surface and the second surface of the thermoelectric device above which the thermoelectric device sustains damage.

5. A method of claim 1, wherein each of the first and the second cooling fluid is a gas or a liquid.

6. A method of claim 1, wherein the first cooling loop further comprises an electrically powered impeller coupled with conductors to receive the output voltage, a portion of the output voltage being used to drive the impeller to circulate the first cooling fluid through the first cooling loop.

7. A method of claim 1, wherein each of the first heat sink and the second heat sink includes a finned planar block or a heat pipe.

8. A method of claim 1, wherein the heat source includes at least one of:
- a waste heat source, including at least one of:
- an engine exhaust;
- an engine cooling system;
- an industrial exhaust; or
- an industrial cooling system; or
- a natural heat source, including at least one of:
- a geothermal source; or
- a radiant heat source.

9. A method of claim 1, wherein the second cooling loop further comprises an electrically powered impeller coupled with conductors to receive the output voltage, a portion of the output voltage being used to drive the impeller to circulate the second cooling fluid through the second cooling loop.

* * * * *